(12) United States Patent
Ando et al.

(10) Patent No.: US 10,192,869 B2
(45) Date of Patent: Jan. 29, 2019

(54) REDUCTION OF NEGATIVE BIAS TEMPERATURE INSTABILITY

(71) Applicant: International Business Machines Corporation, Armonk, NY (US)

(72) Inventors: Takashi Ando, Tuckahoe, NY (US); Barry P. Linder, Hastings-on-Hudson, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/068,940

(22) Filed: Mar. 14, 2016

(65) Prior Publication Data

US 2016/0197073 A1   Jul. 7, 2016

Related U.S. Application Data

(62) Division of application No. 14/585,401, filed on Dec. 30, 2014.

(Continued)

(51) Int. Cl.
*H01L 27/092* (2006.01)
*H01L 21/8238* (2006.01)
(Continued)

(52) U.S. Cl.
CPC .... *H01L 27/0922* (2013.01); *H01L 21/02178* (2013.01); *H01L 21/28088* (2013.01); *H01L 21/28185* (2013.01); *H01L 21/28194* (2013.01); *H01L 21/823842* (2013.01); *H01L 21/823857* (2013.01); *H01L 27/0211* (2013.01); *H01L 27/092* (2013.01); *H01L 29/4966* (2013.01);
(Continued)

(58) Field of Classification Search
CPC ......... H01L 21/28088; H01L 21/28185; H01L 21/28194
See application file for complete search history.

(56) References Cited

U.S. PATENT DOCUMENTS 8,552,505 B1* 10/2013 Kim .................... H01L 29/4966
257/369
2008/0237744 A1* 10/2008 Shin .................. H01L 21/26506
257/408

(Continued)

OTHER PUBLICATIONS

List of IBM Patents or Patent Applications Treated as Related; (Appendix P), Filed Mar. 14, 2016; 2 pages.

(Continued)

*Primary Examiner* — Kyoung Lee
*Assistant Examiner* — Christina Sylvia
(74) *Attorney, Agent, or Firm* — Cantor Colburn LLP; Vazken Alexanian

(57) ABSTRACT

A complementary metal-oxide semiconductor (CMOS) circuit and a method of fabricating the device are described. The circuit includes an n-channel field effect transistor (nFET), the nFET including a high-k dielectric layer on an interlayer. The CMOS circuit also includes a p-channel field effect transistor (pFET), the pFET including the high-k dielectric layer on the interlayer and additionally including an aluminum-based cap layer between the high-k dielectric layer and a pFET work function setting metal. Metal atoms from the cap layer do not intermix with the interlayer.

9 Claims, 5 Drawing Sheets

Related U.S. Application Data

(60) Provisional application No. 61/975,995, filed on Apr. 7, 2014.

(51) Int. Cl.
    *H01L 29/51*     (2006.01)
    *H01L 21/02*     (2006.01)
    *H01L 21/28*     (2006.01)
    *H01L 29/49*     (2006.01)
    *H01L 29/66*     (2006.01)
    *H01L 27/02*     (2006.01)

(52) U.S. Cl.
    CPC .......... *H01L 29/513* (2013.01); *H01L 29/517* (2013.01); *H01L 29/66545* (2013.01)

(56) References Cited

U.S. PATENT DOCUMENTS

| | | | | |
|---|---|---|---|---|
| 2010/0044798 A1* | 2/2010 | Hooker | ........... | H01L 21/823842 257/369 |
| 2012/0139053 A1* | 6/2012 | Ando | ................ | H01L 21/82384 257/369 |
| 2014/0054717 A1* | 2/2014 | Edge | ................. | H01L 21/28088 257/369 |
| 2015/0035073 A1* | 2/2015 | Ando | ................ | H01L 21/28229 257/369 |
| 2015/0325681 A1* | 11/2015 | Lee | ..................... | H01L 29/4966 438/199 |

OTHER PUBLICATIONS

Takashi Ando et al., "Reduction of Negative Bias Temperature Instability", U.S. Appl. No. 14/585,401, filed Dec. 30, 2014.

List of IBM Patents or Patent Applications Treated as Related; (Appendix P), Filed Sep. 12, 2018; 2 pages.

Takashi Ando et al., "Reduction of Negative Bias Temperature Instability", U.S. Appl. No. 16/128,819, filed Sep. 12, 2018.

\* cited by examiner

REDUCTION OF NEGATIVE BIAS TEMPERATURE INSTABILITY

This application is a division of U.S. application Ser. No. 14/585,401 filed Dec. 30, 2014, which claims the benefit of priority to U.S. Provisional Patent Application Ser. No. 61/975,995 filed Apr. 7, 2014, the disclosures of which are incorporated by reference herein in their entirety.

BACKGROUND

The present invention relates to field effect transistors (FETs), and more specifically, to reducing negative bias temperature instability (NBTI).

NBTI deterioration occurs over a period of use and results in an increase in threshold voltage over that period. NBTI affects the reliability of field-effect transistors (FETs) and, because they operate with negative gate-to-source voltage, p-channel FETs (pFETs) in particular. NBTI is known to be related to nitrogen incorporation into the silicon/silicon dioxide ($Si/SiO_2$) interface and results in an increase in threshold voltage. Nitride metal (e.g., titanium nitride TiN), which is commonly used as a pFET work function setting metal, may cause such nitrogen incorporation and result in deteriorated NBTI.

SUMMARY

According to one embodiment of the present invention, a complementary metal-oxide-semiconductor (CMOS) circuit includes an n-channel field effect transistor (nFET), the nFET comprising a high-k dielectric layer on an interlayer; and a p-channel field effect transistor (pFET), the pFET comprising the high-k dielectric layer on the interlayer and additionally including a cap layer between the high-k dielectric layer and a pFET work function setting metal, wherein metal atoms from the cap layer do not intermix with the interlayer.

According to another embodiment, a method of fabricating a semiconductor device including a p-channel field effect transistor (pFET) includes growing an interlayer and a high-k dielectric layer; depositing a cap layer over the high-k dielectric layer; maintaining a temperature after the depositing the cap layer such that no metal atoms from the cap layer diffuse to the interlayer; and depositing a pFET work function setting metal over the cap layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, the use of a metal nitride (e.g., TiN) as a pFET work function setting metal results in NBTI deterioration presenting a challenge for pFETs. It has previously been noted that increasing equivalent oxide thickness (EOT) improves NTBI by decreasing the electric field across the gate oxide. EOT indicates a thickness (e.g., in nanometers (nm)) of a silicon oxide film with a corresponding effect of a high-k material. However, increased EOT also results in performance degradation. Embodiments of the device and method described herein address NBTI by depositing an aluminum-based cap layer and limiting nitrogen diffusion into the $Si/SiO_2$ interface.

Figure 1:
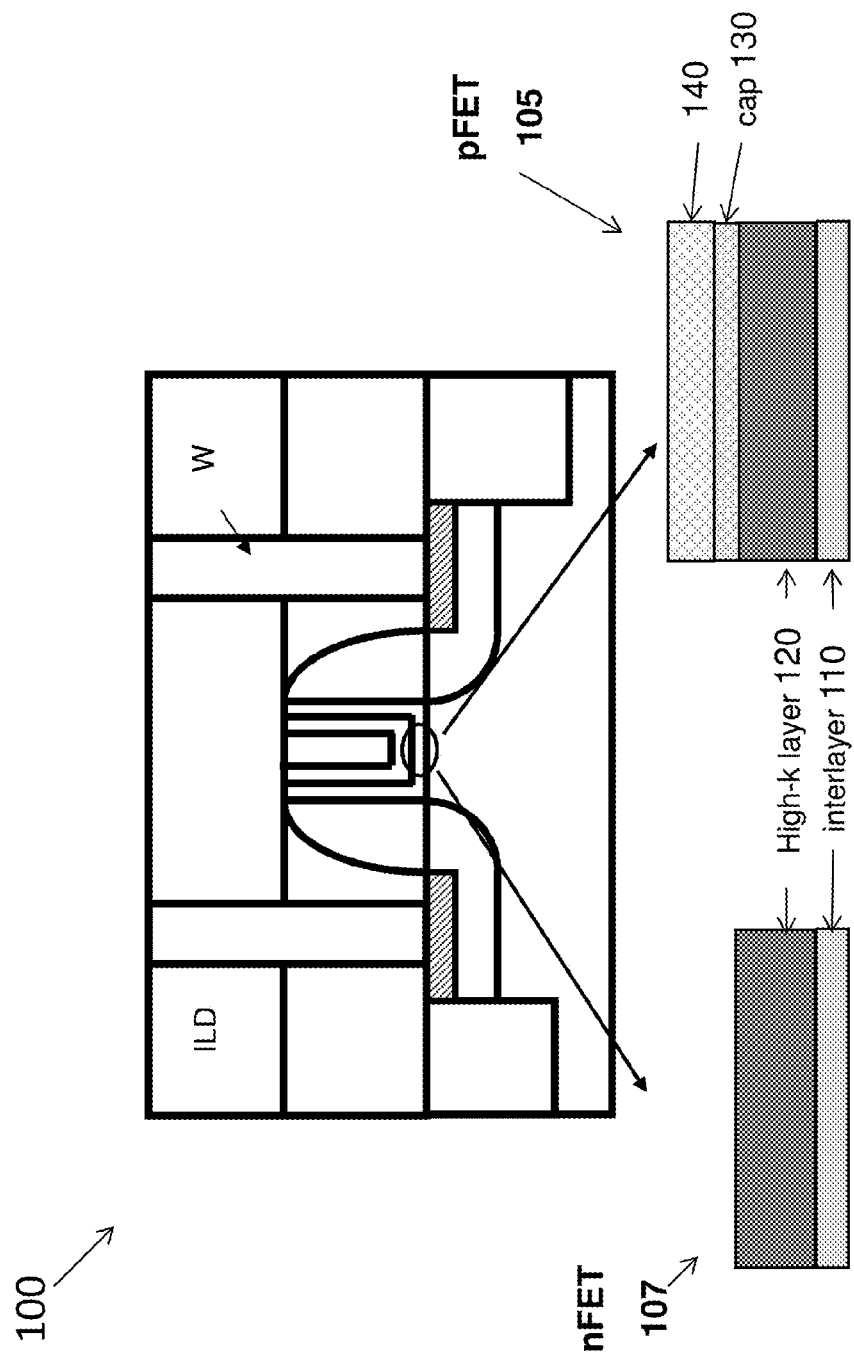
FIG. 1 is a cross-sectional view of a complementary metal-oxide semiconductor (CMOS) device according to an embodiment of the invention.

FIG. 1 is a cross-sectional view of a complementary metal-oxide semiconductor (CMOS) device 100 according to an embodiment of the invention. The CMOS device 100 includes a pFET and nFET pair. The device 100 may be a replacement gate planar or fin field effect transistor (FinFET) structure, for example. The replacement gate process involves removing a dummy gate structure and filling a resulting recessed region ("gate cavity") with a gate dielectric and gate electrode. The replacement gate process is a low temperature flow process in comparison to a gate first process. The NBTI mitigation discussed herein applies to any silicon based component, such as nanowires, for example. Based on the work function setting metal, the device 100 (CMOS) includes a pFET 105 and an nFET 107. The gate structure of the pFET 105 and the nFET 107 are shown in detail in FIG. 1. Both the pFET 105 and nFET 107 include an interlayer 110 dielectric (e.g., a silicon dioxide ($SiO_2$) interfacial layer) and a high-k dielectric layer 120 (e.g., hafnium dioxide ($HfO_2$)). As shown in FIG. 1, the pFET 105 additionally includes a cap layer 130 and a pFET work function setting metal 140. The cap layer 130 may be aluminum oxide ($Al_2O_3$) or a composite of aluminum and nitrogen (e.g., aluminum oxynitride (AlON), aluminum nitride (AlN)). The work function setting metal 140 may be a nitride such as TiN or tantalum nitride (TaN). During deposition or with subsequent thermal treatments, some nitrogen may diffuse from the work function setting metal 140 to the cap 130 layer, as well. The cap layer 130 reduces or prevents diffusion of this nitrogen to the interlayer 110 while minimally affecting the threshold voltage of the device 100.

Because the cap layer 130 reduces or prevents diffusion of nitrogen from the work function setting metal 140 into the interlayer 110, NBTI deterioration and the resulting increase in threshold voltage over a period of use of the device 100 are mitigated or prevented. By maintaining a temperature that is sufficiently low after deposition of the cap layer 130, no metal atoms (e.g., Al from the cap layer 130) are in the interlayer 110. As a result, once the cap layer 130 is applied and the temperature is maintained, the threshold voltage of the device 100 may be kept unchanged (minimally changed). In previous FETs, a cap layer has been applied but temperature has been increased during the subsequent processing to encourage intermixing between the cap layer and the interlayer to alter the threshold voltage. In embodiments discussed herein, a low temperature flow (or replacement gate process) is used rather than a gate first type process to minimize the intermixing of the cap layer 130 and the interlayer 110 and thereby minimally affect threshold voltage. The temperature must be low enough so that aluminum or another material from the cap layer 130 does not diffuse into the gate oxide and affect the threshold voltage. That is, no metal atoms from the cap layer 130 or a layer above the cap layer 130 diffuse to the interlayer 110. For example, the temperature may be maintained below about 800 degrees Celsius to prevent Al penetration through the high-k dielectric layer 120. The thickness of the cap layer 130 corresponds to the effect of the cap layer 130 on effective EOT and, consequently, NBTI. The cap layer 130 increases the EOT of the pFET 105. The thickness of the cap layer 130 represents a tradeoff between increased effectiveness of the cap layer 130 as a diffusion barrier and EOT increase, because as the thickness of the cap layer 130 increases, the effective EOT increases, but the improvement of NBTI also increases. Two exemplary methods by which embodiments of the structure shown in FIG. 1 may be obtained are discussed below.

Figure 2:
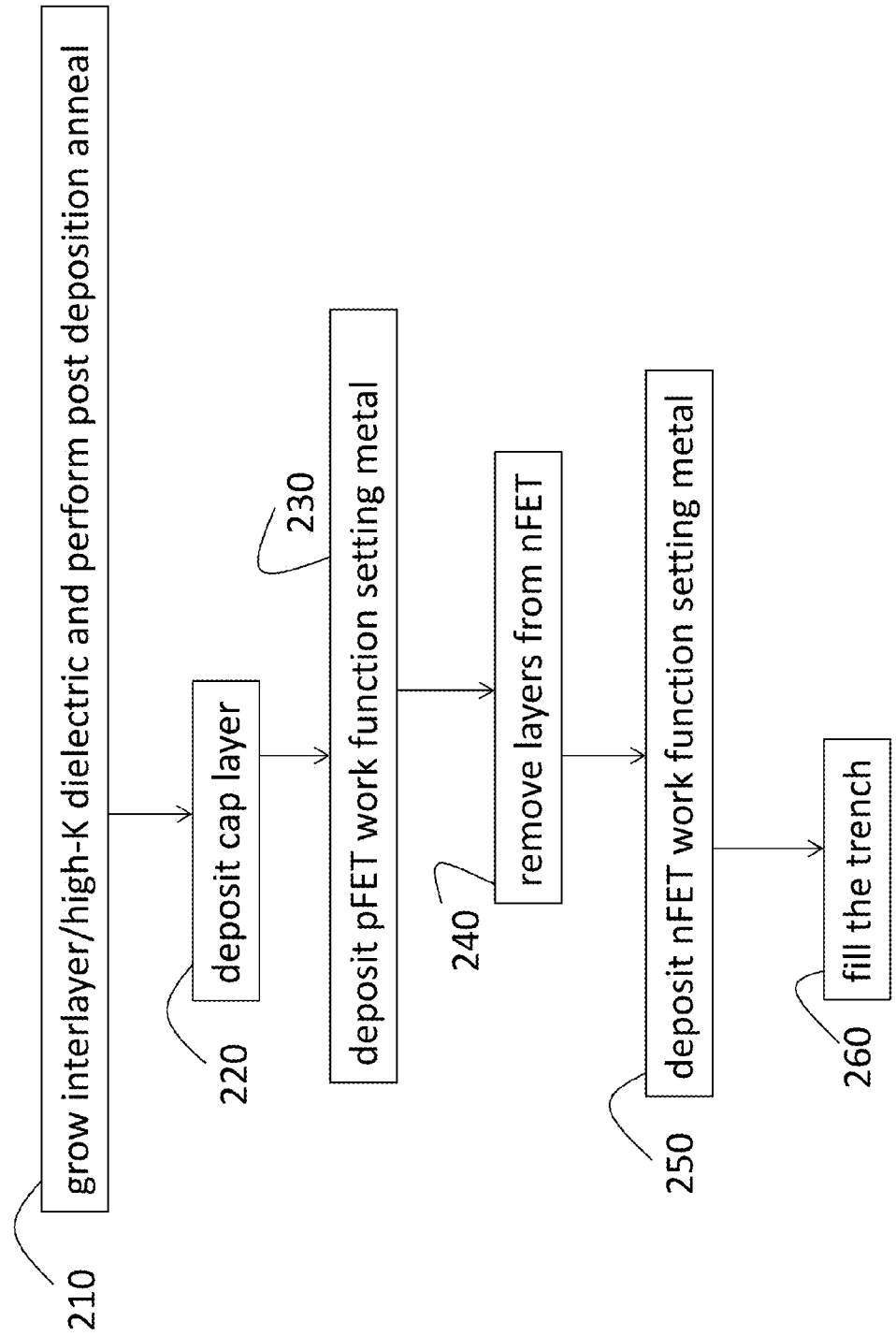
FIG. 2 is a process flow of a method of forming the device shown in FIG. 1 according to one embodiment.

FIG. 2 is a process flow of a method of forming the device 100 structure shown in FIG. 1 according to one embodiment. At block 210, the process shown in FIG. 2 includes growing the interlayer 110 and the high-k dielectric layer 120 and performing a post deposition annealing process. As shown in FIG. 1, this process establishes the first two layers of both the pFET 105 and the nFET 107. At block 220, depositing the cap layer 130 includes depositing $Al_2O_3$, for example, or any other material that reduces or prevents nitrogen diffusion (e.g., a composite of aluminum and nitrogen). At block 230, depositing the pFET work function setting metal 140 includes depositing a nitride such as TiN or TaN. At block 230, both the pFET 105 and the nFET 107 initially have the cap layer 130 and the pFET work function setting metal 140 deposited.

Figure 3:
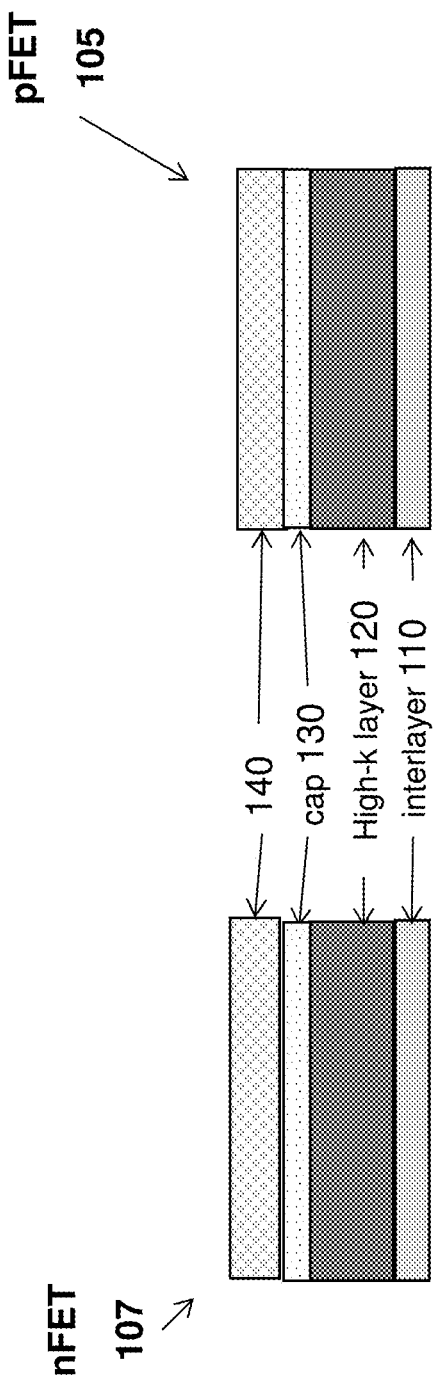
FIG. 3 shows the intermediate structure resulting from the deposition of the cap layer and the pFET work function setting metal.

FIG. 3 shows the intermediate structure resulting from the deposition of the cap layer 130 and the pFET work function setting metal 140. Referring again to FIG. 2, at block 240, removing layers from the nFET 107 includes removing the pFET work function setting metal 140 and the cap layer 130 using, for example, lithography. Hydrogen peroxide ($H_2O_2$) may be used to remove the pFET work function setting metal 140 from the nFET 107. Then ammonium hydroxide ($NH_4OH$) may be heated (e.g., 65 degrees Celsius) to remove an $Al_2O_3$ cap layer 130 from the nFET 107. The device 100 shown in FIG. 1 illustrates the structure resulting at block 240. Depositing an nFET work function setting metal 510 (FIG. 5) at block 250 and filling the trench 260 are not detailed herein because these standard processes do not relate to addressing NBTI deterioration. The nFET work function setting metal 510 may be, for example, TiN or titanium aluminum carbide (TiAlC). Filling the trench may include wetting the work function setting metal (e.g., TiN) deposition and filling with a low-resistivity metal such as tungsten (W). The cap (e.g., $Al_2O_3$) may be converted to AlON after the pFET work function setting metal 140 is deposited (block 230) in the pFET 105. In an alternate embodiment, the cap layer 130 may not be removed from the nFET 107 prior to deposition of the nFET work function setting metal 510. According to this embodiment, the nFET 107 would retain the cap layer 130 in the final device 100 (CMOS).

Figure 4:
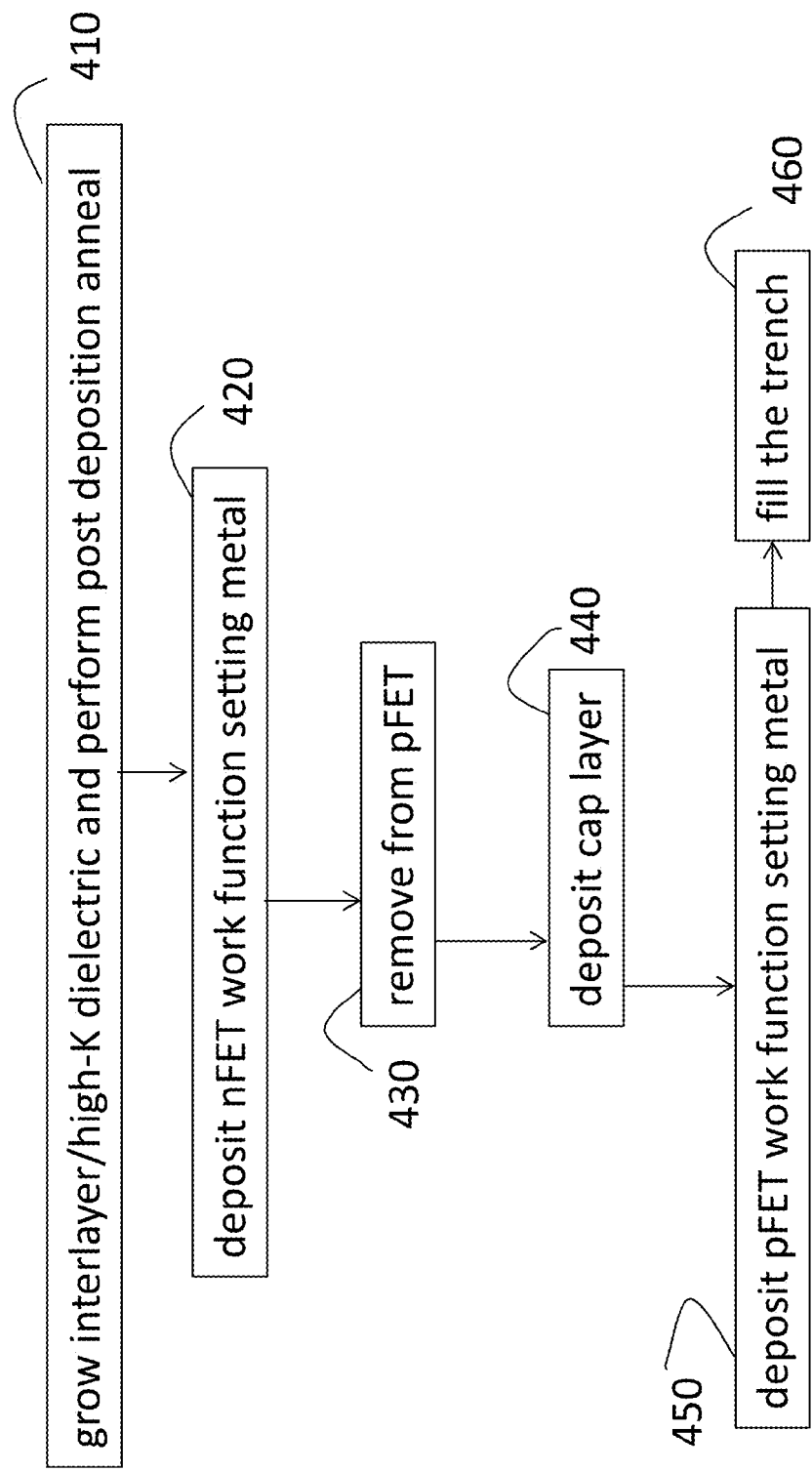
FIG. 4 is a process flow of a method of forming the device shown in FIG. 1 according to another embodiment.

FIG. 4 is a process flow of a method of forming the device 100 structure shown in FIG. 1 according to another embodiment. Forming the first two layers of the pFET 105 and the nFET 107 is done in the same way according to the method shown in FIG. 4 as in the method shown in FIG. 2. At block 410, the process includes growing the interlayer 110 and the high-k dielectric layer 120 and performing a post deposition annealing process. At block 420, depositing the nFET work function setting metal 510 (FIG. 5) includes depositing TiN or TiAlC, for example. This work function setting metal is deposited over both the pFET 105 and the nFET 107.

Figure 5:
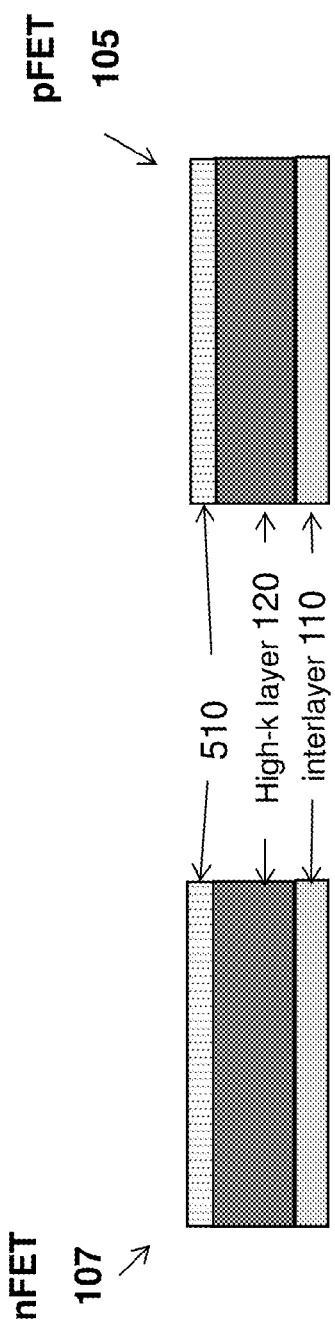
FIG. 5 shows the intermediate structure that results from the deposition of the nFET work function setting metal.
Figure 6:
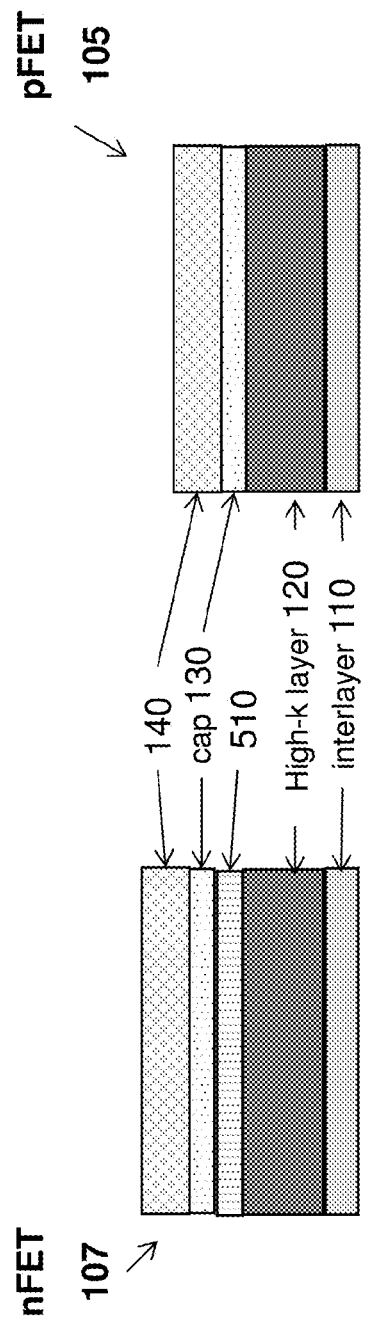
FIG. 6 shows the structure that results from deposition of the cap layer and the pFET work function setting metal.

FIG. 5 shows the intermediate structure that results from the deposition of the nFET work function setting metal 510. At block 430, removing from the pFET 105 includes removing the nFET work function setting metal 510 by lithography, for example. At block 440, depositing the cap layer 130 includes depositing $Al_2O_3$, or any other material that reduces or prevents nitrogen diffusion without affecting the threshold voltage. This cap layer 130 is left on top of the nFET work function setting metal layer 510 on the nFET 107. At block 450, depositing the pFET work function setting metal 140 includes depositing a nitride such as TiN or TaN. Like the cap layer 130, this layer is left on the nFET 107, as well. FIG. 6 shows the structure that results from deposition of the cap layer 130 and the pFET work function setting metal 140. The structure in FIG. 6 is an alternate embodiment of the structure of the device 100 shown in FIG. 1. Block 360 includes filling the trench with tungsten (W), for example, which is also done according to the method shown in FIG. 2.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just examples. There may be many variations to the diagrams or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A complementary metal-oxide semiconductor (CMOS) circuit, comprising:
    an n-channel field effect transistor (nFET), the nFET comprising a high-k dielectric layer on an interlayer, an nFET work function setting metal on the high-k dielectric layer, a cap layer on the nFET work function setting metal, and a pFET work function setting metal on the cap layer, wherein the interlayer is silicon dioxide ($SiO_2$); and
    a p-channel field effect transistor (pFET), the pFET comprising the high-k dielectric layer directly on the interlayer, the cap layer directly on the high-k dielectric layer, and the pFET work function setting metal directly on the cap layer, wherein the cap layer is aluminum-based and the pFET work function setting metal is a nitride and metal atoms from the cap layer do not intermix with the interlayer.

2. The circuit according to claim 1, wherein the high-k dielectric layer is hafnium dioxide ($HfO_2$).

3. The circuit according to claim 1, wherein the cap layer reduces nitrogen diffusion from the pFET work function setting metal to the interlayer.

4. The circuit according to claim 3, wherein the cap layer comprises aluminum oxide ($Al_2O_3$) or a composite of aluminum and nitrogen.

5. The circuit according to claim 1, wherein the pFET work function setting metal is titanium nitride (TiN).

6. The circuit according to claim 1, wherein the pFET work function setting metal is tantalum nitride (TaN).

7. The circuit according to claim 1, wherein a temperature of the circuit is configured to be below a minimum temperature needed for diffusion of the metal atoms from the cap layer to the interlayer.

8. The circuit according to claim 7, wherein the temperature minimizes a change in threshold voltage of the circuit over a period of use of the device.

9. The circuit according to claim 7, wherein the minimum temperature needed for diffusion of the metal atoms from the cap layer to the interlayer is 800 degrees Celsius.

* * * * *